United States Patent
Amurao et al.

(10) Patent No.: US 7,836,583 B2
(45) Date of Patent: Nov. 23, 2010

(54) INTEGRATED CIRCUIT DISMOUNTER

(75) Inventors: Jonathan Amurao, Batangas (PH); Richard Coles, Tarlac (PH); Carmela Mendoza, Marikina (PH); Rey Roger M. Pulmano, Muntinlupa (PH)

(73) Assignee: Hitachi Global Storage Technologies, Netherlands, B.V., Amsterdam (NL)

( * ) Notice: Subject to any disclaimer, the term of this patent is extended or adjusted under 35 U.S.C. 154(b) by 188 days.

(21) Appl. No.: 12/005,965

(22) Filed: Dec. 28, 2007

(65) Prior Publication Data
US 2009/0165292 A1 Jul. 2, 2009

(51) Int. Cl.
*B23P 19/00* (2006.01)
(52) U.S. Cl. .................. 29/762; 29/603.03; 29/739; 29/743; 29/832; 228/6.2; 228/264; 219/388; 361/704
(58) Field of Classification Search ............... 29/739, 29/743, 603.03, 760, 762, 832, 741, 740; 228/6.2, 264; 219/388; 361/704; 360/97.01; 414/416.09
See application file for complete search history.

(56) References Cited

U.S. PATENT DOCUMENTS

| | | | | |
|---|---|---|---|---|
| 4,528,746 A | * | 7/1985 | Yoshimura | .................... 29/743 |
| 4,597,174 A | | 7/1986 | Sevigny | |
| 4,828,162 A | * | 5/1989 | Donner et al. | ................ 228/6.2 |
| 5,232,144 A | * | 8/1993 | Carney et al. | ................ 228/6.2 |
| 5,419,481 A | * | 5/1995 | Lasto et al. | ................... 228/6.2 |
| 5,560,531 A | * | 10/1996 | Ruszowski | .................... 228/19 |
| 5,605,277 A | * | 2/1997 | Jackson et al. | ............... 228/264 |
| 6,163,014 A | | 12/2000 | Bergeron et al. | |
| 6,279,225 B1 | | 8/2001 | Martin et al. | |
| 6,487,079 B2 | * | 11/2002 | Katsui | ........................ 361/704 |
| 6,490,123 B1 | * | 12/2002 | Okunaga et al. | .......... 360/97.01 |
| 6,620,250 B2 | * | 9/2003 | Brezoczky et al. | ........... 118/715 |
| 6,869,264 B2 | | 3/2005 | Yoo | |
| 7,028,396 B2 | | 4/2006 | Hassan | |
| 2004/0200064 A1 | | 10/2004 | Hassan | |
| 2008/0156789 A1 | * | 7/2008 | Devey et al. | ............. 219/444.1 |

FOREIGN PATENT DOCUMENTS

| | | |
|---|---|---|
| JP | 61255032 | 11/1986 |
| WO | WO-03028933 | 4/2003 |

OTHER PUBLICATIONS

Gowda, et al., "Rework and Reliability of Underfilled CSP Assemblies", (2002), 458-466.

* cited by examiner

*Primary Examiner*—Derris H Banks
*Assistant Examiner*—Jeffrey Carley

(57) ABSTRACT

The present invention provides a system and method for providing a improved device for dismounting integrated circuits for rework tools in the fabrication and manufacture of hard disk drives. Embodiments of the present invention include a vacuum cap with suction capabilities for dismounting the integrated circuits. The vacuum cap includes a cylindrical portion with a vacuum path for holding a rod-like vacuum cylinder which when pressurized causes the integrated circuit to dismount. Embodiments of the present invention further include a light weight aluminum heat-shield that is disposed around the vacuum cap to protect the vacuum cap from excessive heat and to preserve the suction capabilities of the vacuum cap. In one embodiment the heat shield acts as a stopper to prevent the vacuum cap from moving upwards and helps the vacuum cap from absorbing multiple mechanical stress in order to protect the vacuum cylinder from being damaged.

9 Claims, 4 Drawing Sheets

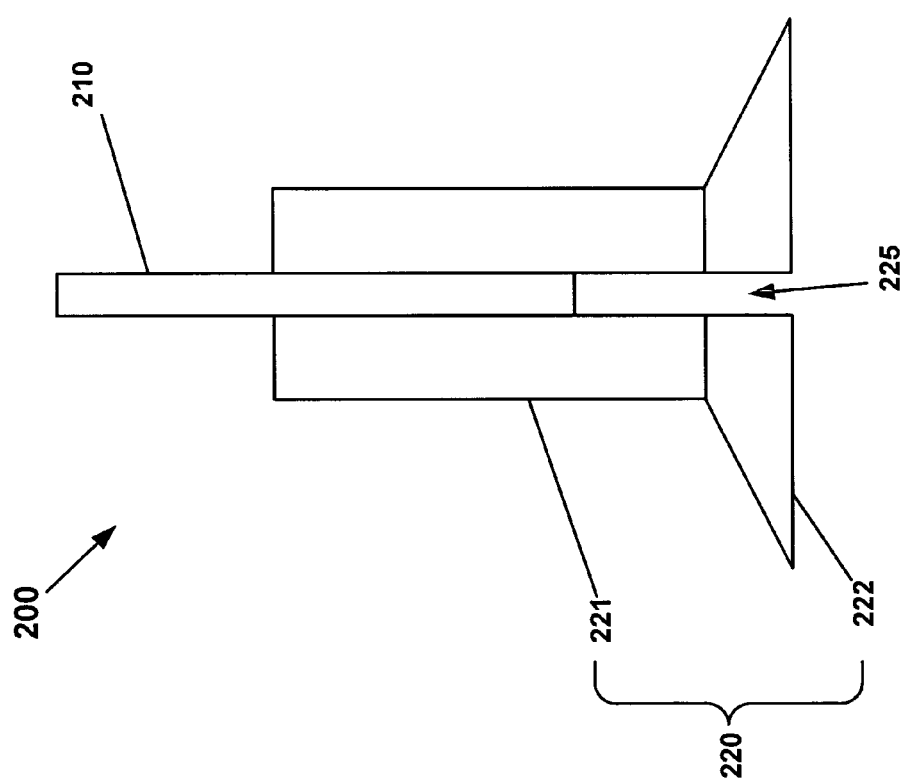

INTEGRATED CIRCUIT DISMOUNTER

TECHNICAL FIELD

The present invention relates generally to a method and a system for manufacturing and fabricating hard drive components in a manufacturing environment, and more particularly, to a providing a electrostatic protection circuit to protect magnetoresistive heads of the hard disk drive.

BACKGROUND ART

As known in the art, a hand tool may be used to engage an integrated circuit chip and either install or remove the chip from its installation. A typical tool utilizes a set of jaws each having a row of teeth for insertion between the pins of the chip. In the typical prior art tool, the jaws are held in the closed position with spring tension and are forced into the open position with a hand operated plunger which may be forced between the jaws may be positioned to accept a chip within and have the teeth aligned with the spaces between the pins.

In this engaged position, an integrated circuit (IC) may be removed from its installation by exerting a pulling force on the tool so that the underside of the chip is engaged by the teeth and the pulling force is distributed between the teeth in the pulling direction and the chip is removed. It is important to exert the pulling force in a direction perpendicular to the surface of the installation so that the chip is removed straight out.

This prevents the bending of the chip's pins which are extremely delicate. This is often difficult to achieve, especially with chips having a larger number of pins, because of the high degree of hand-eye coordination required. Although many IC chips are mounted in sockets whereby the chip is held in place merely by the spring tension exerted against individual pins in their sockets and other chips may be similarly susceptible to easy removal, some installations require that a chip be bonded on its underside with a heat conductive adhesive to a heat sink. The removal of such a chip with a prior art hand tool without bending any pins and damaging the hand tool is extremely difficult at best.

In the manufacturing of the disk drive, many components with high electrical sensitivities are fabricated and manufactured. Devices such as the heads, sliders, etc., have electrical sensitivities to electromagnetic interferences or electrostatic discharge that requires the manufacturing environment worker to exercise great caution in the manufacturing of these components. Integrated Circuit components such as suspensions comprise of conductive materials which tend to have conductive traces that are typically supported by insulative materials to help reduce the potential for electrostatic discharge or electromagnetic interference. When the suspension or similar components come into contact with each other.

Having a IC component removal tool that is durable and also prevents the potential for electrostatic discharge by the components during manufacturing is crucial to reduce cost and ensure component integrity.

Therefore, what is need is a flexible way of component fabrication and manufacturing and removal that does not result in damaged components and result in unnecessary expense and waste.

SUMMARY

In accordance with certain aspects of the present invention, there is provided a system and method for providing a improved device for dismounting integrated circuits for rework tools in the fabrication and manufacture of hard disk drives.

Embodiments of the present invention include a vacuum cap with suction capabilities for dismounting the integrated circuits. The vacuum cap includes a cylindrical portion with a vacuum path for holding a rod-like vacuum cylinder which when pressurized causes the integrated circuit to dismount.

Embodiments of the present invention further include a light weight aluminum heat-shield that is disposed around the vacuum cap to protect the vacuum cap from excessive heat and to preserve the suction capabilities of the vacuum cap. In one embodiment the heat shield acts as a stopper to prevent the vacuum cap from moving upwards and helps the vacuum cap from absorbing multiple mechanical stress in order to protect the vacuum cylinder from being damaged.

BRIEF DESCRIPTION OF THE DRAWINGS

The accompanying drawings, which are incorporated in and constitute a part of the specification, illustrate embodiments of the invention, and together with the general description given above and the detailed description given below serve to explain the teachings of the invention.

BEST MODES FOR CARRYING OUT THE INVENTION

Reference will now be made in detail to the alternative embodiment(s) of the present invention. While the invention will be described in conjunction with the alternative embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

The discussion will begin with an overview of a hard disk drive and components connected therewith. The discussion will then focus on embodiments of a method and system for providing a light-weight heat conductive material to protect integrated circuit components dismounting tools from excessive heat and mechanical stress during the manufacturing of the hard disk drive in a disk drive assembly environment.

Overview

In general, the HDD comb (also referred to as an E-block) serves as a platform on which the suspensions (compliant members containing sliders with recording heads) are mounted. The recording heads fly at a constant height (on the order of nanometers) above the disk surface tracking prewritten servo information. An HDD carriage assembly (as shown in FIG. 1) forms the primary motive mechanical system that enables a disk-drive to randomly access data to be written or recorded on the disk surfaces.

Figure 1:
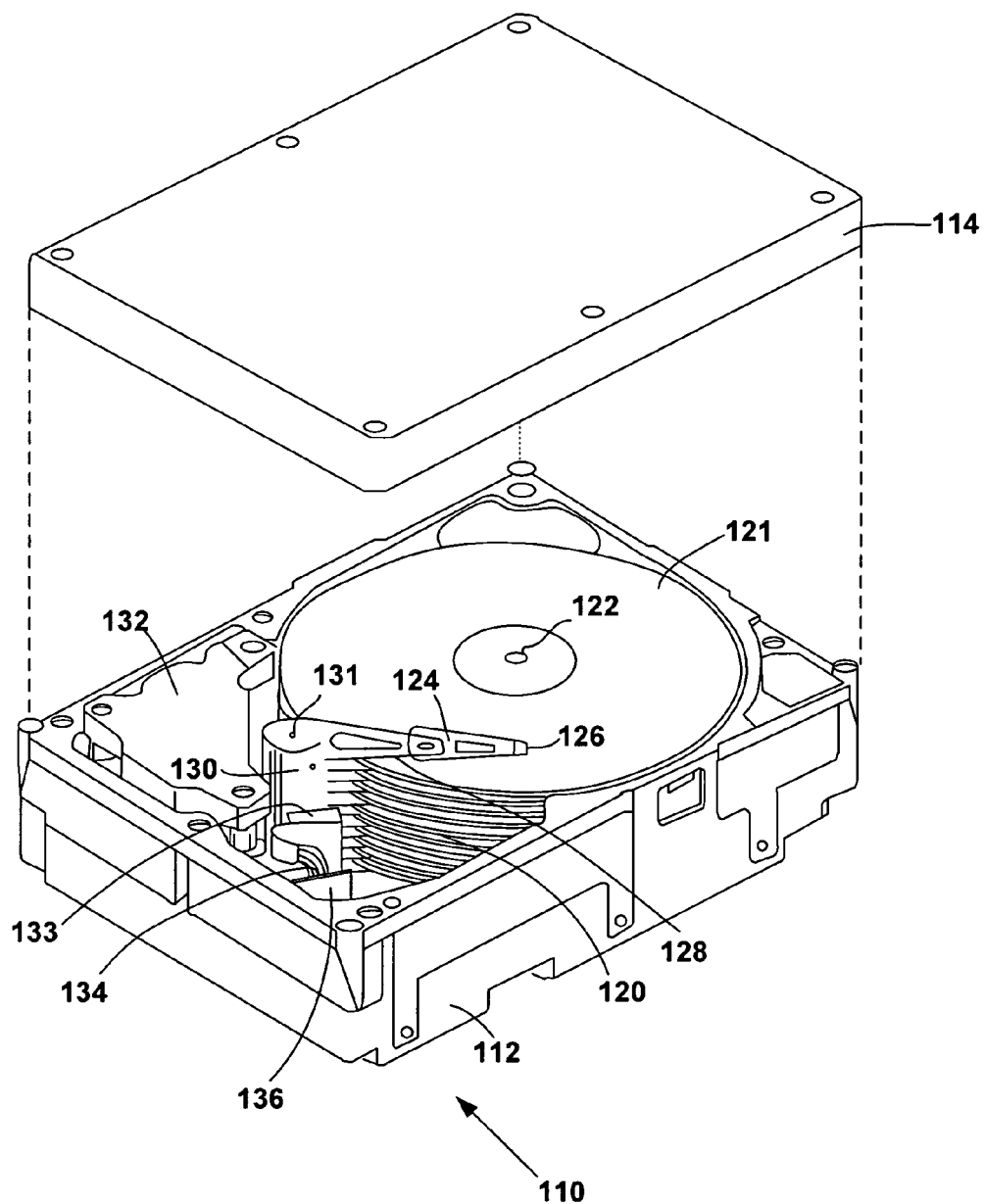
FIG. 1 is a plan view of an HDD in accordance with one embodiment of the present invention.

With reference now to FIG. 1 shows a disk drive system designated by the general reference number 100. The cover 110 of the disk drive 100 is shown exploded. In operation, the cover 110 would be disposed on top of the housing 120. The disk drive 100 comprises one or more magnetic disks 140. The disks 140 may be conventional particulate or thin film recording disks, which are capable of storing digital data in concentric tracks. In one embodiment, both sides of the disks 140 are available for storage, and it will be recognized by one of ordinary skill in the art that the disks drive 100 may include any number of such disks 140.

The disks 140 are mounted to a spindle 150. The spindle 150 is attached to a spindle motor which rotates the spindle 150 and the disks 140 to provide read/write access to the various portions of the concentric tracks on the disks 140.

An actuator assembly 160 includes a positioner arm 170 and a suspension assembly 180. The suspension assembly 180 includes a slider assembly 190 at its distal end. Although only one slider assembly 180 is shown, it will be recognized by one skilled in the relevant art the disk drive 100 could have one slider assembly 190 for each positioner arm 170. The positioner arm 128 further comprises a pivot 131 around which the positioner arm 128 pivots.

The disk drive 100 further includes a amplifier chip 133. As is well known in the art, the amplifier chip 133 cooperates with the slider assembly on the slider assembly 126 to read data from or write data to the disks 121. The main function of the actuator assembly 130 is to move the positioner arm 128 around the pivot 131.

Figure 2:
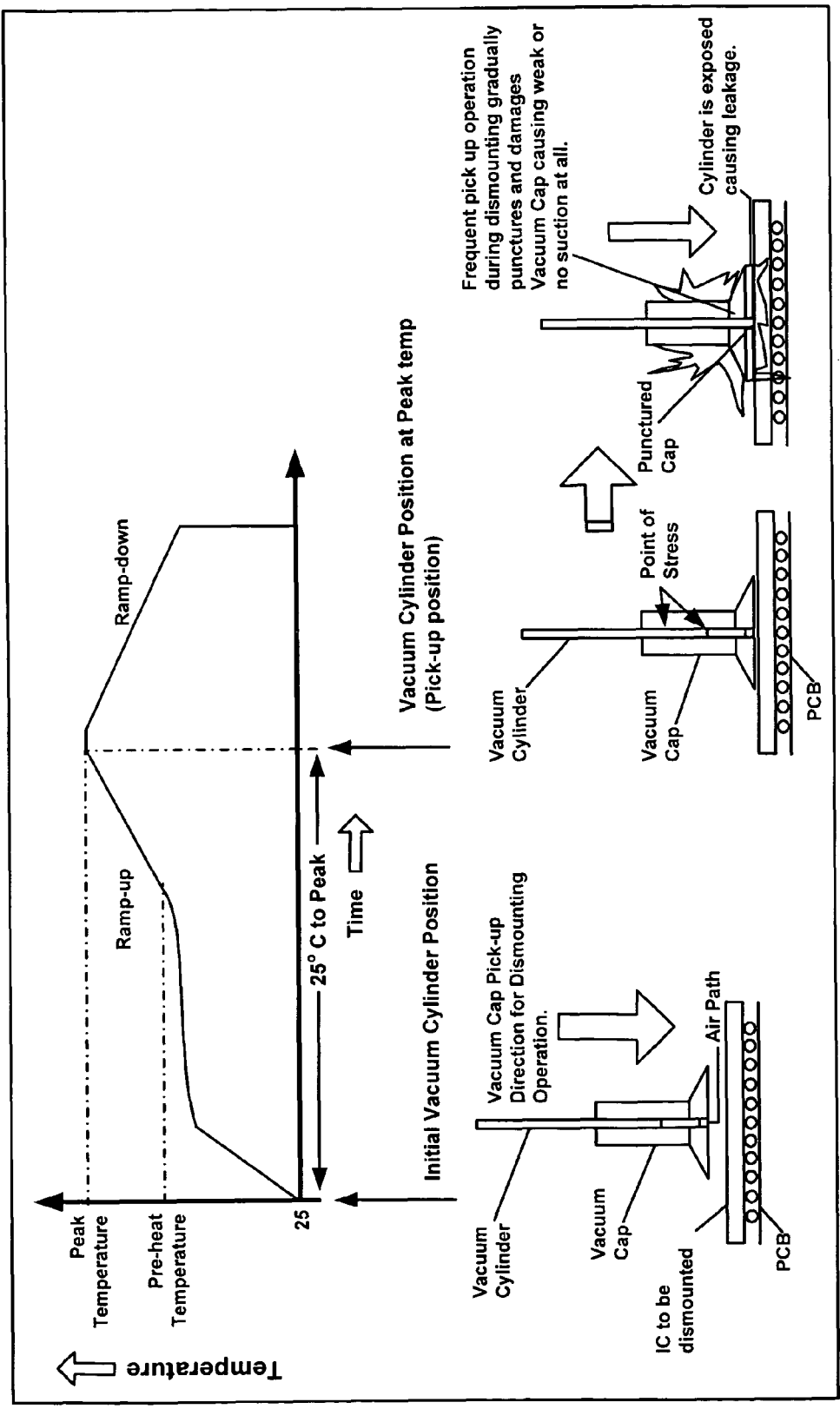
FIGS. 2A-2D illustrate a cross sectional view of a integrated circuit dismounter having a vacuum cap and a vacuum cylinder.

With reference now to FIGS. 2A is shown an exemplary cross sectional view of a integrated circuit dismounting device. As shown in FIG. 2A, the integrated circuiting dismount device 200 comprises a vacuum cap 220 and a vacuum cylinder 210. The vacuum cap 220 includes a first cylindrical portion 221, a flat suction base 222 and a vacuum path 225. When in operation as illustrated in FIGS. 2B-2D, the flat suction base 222 is attached to the integrated circuit or semiconductor chip being dismounted. Pressure is then applied to the rod-like vacuum cylinder 210 and as the temperature of the integrated circuit is elevated, the vacuum in the vacuum path 225 suctions off the integrated circuit.

In the example shown in FIGS. 2B-2D, when the temperature of the integrated circuits becomes excessive (e.g., reaches 25° C., and pressure is applied to the vacuum cylinder 210, the vacuum cap 220 begins to lose its suction capabilities. As shown in FIG. 2D as the vacuum cap 220 loses its suction, any pressure applied on the vacuum cylinder 210, causes the vacuum cylinder 210 to encroach the suction base 222 of the vacuum cap 220. This results in the vacuum cap 220 being damages and unable to dismount the integrated circuit. The excessive temperature build-up on the vacuum cap 220 also causes stress on the vacuum cap 220 a bonding wire 230.

Figure 3:
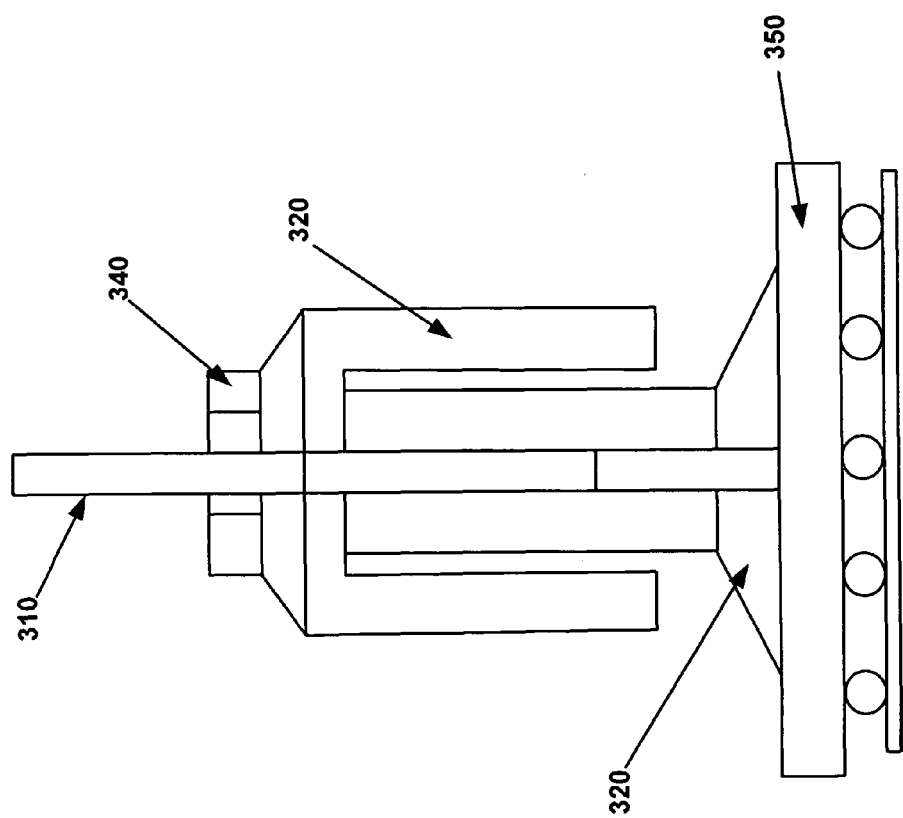
FIG. 3 is a cross sectional view of one embodiment of the improved integrated circuit dismounter in accordance to one embodiment of the present invention.

FIG. 3 is an exemplary cross section view of one embodiment of the integrated circuit dismount device 300 in accordance with the teachings of the present invention. As shown in FIG. 3, the integrated circuit dismount device 300 comprises a rod-like vacuum cylinder 310, a heat shield 320, vacuum cap 330 and fastener 340.

In one embodiment, the heat shield 320 is disposed around the cylindrical end of the vacuum cap 330 to enable the heat shield 320 to protect the vacuum cap 330 from excessive heat applied to the underlying integrated circuit 350 being removed. In one embodiment, the heat shield also acts as a stopping mechanism to an upward movement of the vacuum cap 330 when the targeted integrated circuit is being removed. This ensures reduces stress on the vacuum cap 330 while ensuring that the suction capabilities of the vacuum cap 330 is preserved.

Thus, by diverting heat to the heat shield, the vacuum is protected from being damaged by excessive heat and vertical mechanical stress. The underlying underlying integrated circuit component being removed is also protected from being damaged.

In one embodiment, the heatshield 320 is a light-weight heat conductive material such as aluminum or the like. In one embodiment, the fastener 340 is a high temperature epoxy. In another embodiment, the fastener 340 is a screw nut.

Example embodiments of the present technology are thus described. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit dismounting device, comprising:
   a vacuum cap having a cylindrical portion and a flat suction base;
   a pressure applicator disposed within the cylindrical portion of the vacuum cap;
   a heat shield disposed around the cylindrical portion of the vacuum cap to control upward projection movements of the vacuum cap as pressure is applied to the pressure applicator to dismount an integrated circuit; and
   a thermal epoxy retainer applied to the heat shield to couple the heat shield to the vacuum cap.

2. The integrated circuit dismounting device of claim 1, wherein the heat shield is made of a light-weight heat conductive material.

3. The integrated circuit dismounting device of claim 2, wherein the light-weight heat conductive material is aluminum.

4. The integrated circuit dismounting device of claim 3, wherein the heat shield absorbs excessive heat from the vacuum cap to prevent the vacuum cap from being damaged.

5. The integrated circuit dismount device of claim 4, wherein the heat shield protects the vacuum cap from moving upwards when pressure is applied to the cylindrical receptor.

6. A dismount tool for removing semiconductor chip from a printed circuit board in a hard disk drive, the dismount tool comprising:
   a vacuum cylinder;
   a vacuum cap having a first cylindrical portion and a suction base, the vacuum cylinder inserted into the first cylindrical portion of the vacuum cap;
   a heat shield disposed to cover the first cylindrical portion of the vacuum cap to protect the vacuum cap from being damaged by heat applied to the semiconductor chip being removed; and
   a thermal epoxy fastener for attaching the heat shield to the vacuum cap.

7. The dismount tool of claim 6, wherein the heat shield is made of a light-weight heat conductive material.

8. The dismount tool of claim 7, wherein the heat shield is a heat stopper.

9. A method for proving a dismount tool for removing semiconductor chip from a printed circuit board in a hard disk drive, the method comprising providing a vacuum cylinder;

providing a vacuum cap having a first cylindrical portion and a suction base, the vacuum cylinder inserted into the first cylindrical portion of the vacuum cap;

providing a heat shield disposed to cover the first cylindrical portion of the vacuum cap to protect the vacuum cap from being damaged by heat applied to the semiconductor chip being removed; and providing a thermal epoxy fastener for attaching the heat shield to the vacuum cap.

* * * * *